(12) United States Patent
Jeong et al.

(10) Patent No.: US 12,374,614 B2
(45) Date of Patent: Jul. 29, 2025

(54) SEMICONDUCTOR DEVICE AND SEMICONDUCTOR DEVICE MANUFACTURING METHOD WITH HIGH-VOLTAGE ISOLATION CAPACITOR

(71) Applicant: SK keyfoundry Inc., Cheongju-si (KR)

(72) Inventors: Jong Yeul Jeong, Cheongju-si (KR); Jeong Ho Sheen, Cheongju-si (KR); Sang Geun Koo, Cheongju-si (KR); Kang Sup Shin, Cheongju-si (KR)

(73) Assignee: SK keyfoundry Inc., Cheongju-si (KR)

( * ) Notice: Subject to any disclaimer, the term of this patent is extended or adjusted under 35 U.S.C. 154(b) by 400 days.

(21) Appl. No.: 18/116,397

(22) Filed: Mar. 2, 2023

(65) Prior Publication Data

US 2024/0063111 A1 Feb. 22, 2024

(30) Foreign Application Priority Data

Aug. 22, 2022 (KR) .................. 10-2022-0104672

(51) Int. Cl.
| | |
|---|---|
| H10D 1/68 | (2025.01) |
| H01L 23/522 | (2006.01) |
| H10D 1/00 | (2025.01) |
| H10D 84/00 | (2025.01) |

(52) U.S. Cl.
CPC ...... H01L 23/5223 (2013.01); H01L 23/5226 (2013.01); H10D 1/042 (2025.01); H10D 1/716 (2025.01); H10D 84/212 (2025.01)

(58) Field of Classification Search
CPC ........ H10D 1/042; H10D 84/212; H10D 1/68; H10D 1/716; H10D 1/692; H10D 1/696; H01L 23/5223; H01L 23/5226; H01L 21/76895
See application file for complete search history.

(56) References Cited

U.S. PATENT DOCUMENTS 12,191,248 B2 * 1/2025 Lo ............... H01L 21/76877
2012/0187536 A1 7/2012 Dunn et al.
(Continued)

OTHER PUBLICATIONS

Korean Office Action issued on Sep. 26, 2024, in counterpart Korean Patent Application No. 10-2022-0104672 (6 pages in English, 5 pages in Korean).

*Primary Examiner* — Moazzam Hossain
(74) *Attorney, Agent, or Firm* — NSIP Law

(57) ABSTRACT

A method for manufacturing a semiconductor device is provided. The method includes providing a high-voltage isolation capacitor region and a mixed-signal integrated circuit region on a substrate, forming a bottom electrode on the high-voltage isolation capacitor region, forming a bottom metal line on the mixed-signal integrated circuit region, forming an inter-metal dielectric layer on the bottom electrode and the bottom metal line, forming a top via in the inter-metal dielectric layer, forming a low bandgap dielectric layer on the top via and the inter-metal dielectric layer, patterning the low bandgap dielectric layer to form a patterned low bandgap dielectric layer, depositing a thick metal film on the top via and the patterned low bandgap dielectric layer, and patterning the thick metal film to form a top metal line on the high-voltage isolation capacitor region and form a top electrode on the mixed-signal integrated circuit region.

11 Claims, 7 Drawing Sheets

(56) References Cited

U.S. PATENT DOCUMENTS

| | | | |
|---|---|---|---|
| 2015/0333055 A1* | 11/2015 | West | H10D 30/021 |
| | | | 257/306 |
| 2016/0163785 A1 | 6/2016 | West et al. | |
| 2016/0172434 A1 | 6/2016 | West et al. | |
| 2017/0263696 A1 | 9/2017 | West et al. | |
| 2019/0074350 A1 | 3/2019 | West et al. | |
| 2020/0312794 A1 | 10/2020 | West et al. | |
| 2023/0154974 A1* | 5/2023 | Stewart | H01L 23/49575 |
| | | | 257/532 |

* cited by examiner

SEMICONDUCTOR DEVICE AND SEMICONDUCTOR DEVICE MANUFACTURING METHOD WITH HIGH-VOLTAGE ISOLATION CAPACITOR

CROSS-REFERENCE TO RELATED APPLICATIONS

This application claims the benefit under 35 USC § 119(a) of Korean Patent Application No. 10-2022-0104672, filed on Aug. 22, 2022, in the Korean Intellectual Property Office, the entire disclosure of which is incorporated herein by reference for all purposes.

BACKGROUND

1. Field

The following description relates to manufacturing method for a semiconductor device having a high-voltage isolation capacitor.

2. Description of Related Art

Digital Isolators electrically separate circuits but still allow for digital signals to be transferred between them, and support high-voltage isolation ratings up to 5 kV. Digital isolators use transformers or capacitors to magnetically or capacitively couple data across an isolation barrier. Capacitive isolation employs high-voltage isolation capacitors to couple data signals across the isolation barrier. A thick oxide interlayer insulating film as the isolation barrier is incorporated into the high-voltage isolation capacitors in a semiconductor device to obtain the high voltage isolation. However, it is hard to increase the high-voltage isolation by merely increasing a thickness of the thick oxide interlayer insulating film. To increase the high-voltage isolation, low bandgap materials having a bandgap lower than the thick oxide interlayer insulating film are recently incorporated into the high-voltage isolation capacitors.

Employing the lower bandgap materials may induce undesired leakage current in a mixed analog-digital circuit region of the semiconductor device. Integration process with the high-voltage isolation capacitors is required to reduce the leakage current in the mixed analog-digital circuit region.

SUMMARY

This Summary is provided to introduce a selection of concepts in a simplified form that is further described below in the Detailed Description. This Summary is not intended to identify key features or essential features of the claimed subject matter, nor is it intended to be used as an aid in determining the scope of the claimed subject matter.

In one general aspect, a method for manufacturing a semiconductor device is provided. The method includes providing a high-voltage isolation capacitor region and a mixed-signal integrated circuit region on a substrate, forming a bottom electrode on the high-voltage isolation capacitor region, forming a bottom metal line on the mixed-signal integrated circuit region, forming an inter-metal dielectric layer on the bottom electrode and the bottom metal line, forming a top via in the inter-metal dielectric layer, forming a low bandgap dielectric layer on the top via and the inter-metal dielectric layer, patterning the low bandgap dielectric layer to form a patterned low bandgap dielectric layer, depositing a thick metal film on the top via and the patterned low bandgap dielectric layer, and patterning the thick metal film to form a top metal line on the high-voltage isolation capacitor region and form a top electrode on the mixed-signal integrated circuit region, wherein the top metal line is connected to the top via, and wherein the patterned low bandgap dielectric layer is retained under the top electrode, and is absent under the top metal line.

The method may further include forming a hard mask layer on the thick metal film; and patterning the hard mask layer to form a patterned hard mask layer on each of the top metal line and the top electrode.

The method may further include forming a passivation layer on, and in direct contact with, the patterned low bandgap dielectric layer, the top metal line and the top electrode.

The patterned low bandgap dielectric layer may include a first portion overlapped with the top electrode and having a first thickness, and a second portion outside the top electrode having a second thickness less than the first thickness.

The patterned low bandgap dielectric layer may include a first sub-low bandgap dielectric layer having a first thickness, and a second sub-low bandgap dielectric layer having a second thickness which is greater than the first thickness.

The second sub-low bandgap dielectric layer may include a first portion overlapped with the top electrode, and a second portion outside the top electrode having a thickness that is less than a thickness of the first portion.

In another general aspect, a semiconductor device manufacturing method includes forming a bottom electrode and a bottom metal line in a substrate, forming an inter-metal dielectric layer on the bottom electrode and the bottom metal line, forming an inter-metal line overlapping the bottom metal line, forming a via connected to the inter-metal line, depositing a low bandgap dielectric layer on the via and the inter-metal dielectric layer, removing a portion of the low bandgap dielectric layer which overlaps the via to expose a top surface of the via, and retaining the low bandgap dielectric layer overlapped with the bottom electrode, depositing a thick metal film on the exposed via and the low bandgap dielectric layer, and patterning the thick metal film to form a top metal line and form a top electrode. The top metal line may be connected to the via, and the low bandgap dielectric layer may be retained under the top electrode, and is absent under the top metal line.

The method may further include forming a hard mask layer on each of the top metal line and the top electrode, and forming a passivation layer on the hard mask layer. The passivation layer may be in direct contact with the low bandgap dielectric layer, the top metal line and the top electrode.

The low bandgap dielectric layer may include a first portion overlapped with the top electrode and having a first thickness, and a second portion disposed outside the top electrode having a second thickness smaller than the first thickness.

The low bandgap dielectric layer may include a first sub-low bandgap dielectric layer having a first thickness, and a second sub-low bandgap dielectric layer having a second thickness that is greater than the first thickness.

The second sub-low bandgap dielectric layer may include a first portion overlapped with the top electrode, and a second portion disposed outside the top electrode having a thickness that is less than a thickness of the first portion.

Other features and aspects will be apparent from the following detailed description, the drawings, and the claims.

BRIEF DESCRIPTION OF DRAWINGS

FIG. 1 is a diagram illustrating semiconductor device in accordance with one or more embodiments.

FIG. 2 is a diagram illustrating a first etching process in accordance with one or more embodiments.

FIG. 3 is a diagram illustrating a second etching process in accordance with one or more embodiments.

FIG. 4 is a diagram illustrating a thick metal film formed on an exposed second via and a patterned low bandgap dielectric layer in accordance with one or more embodiments.

FIG. 5 is a diagram illustrating a third etching process in accordance with one or more embodiments.

FIG. 6 is a diagram illustrating the low bandgap dielectric layer having similar height to the top metal line and parallel with the top metal line in accordance with the present disclosure.

FIG. 7 is a diagram illustrating a passivation layer deposited to cover the top metal line and the top electrode in accordance with the present disclosure.

Figure 1:
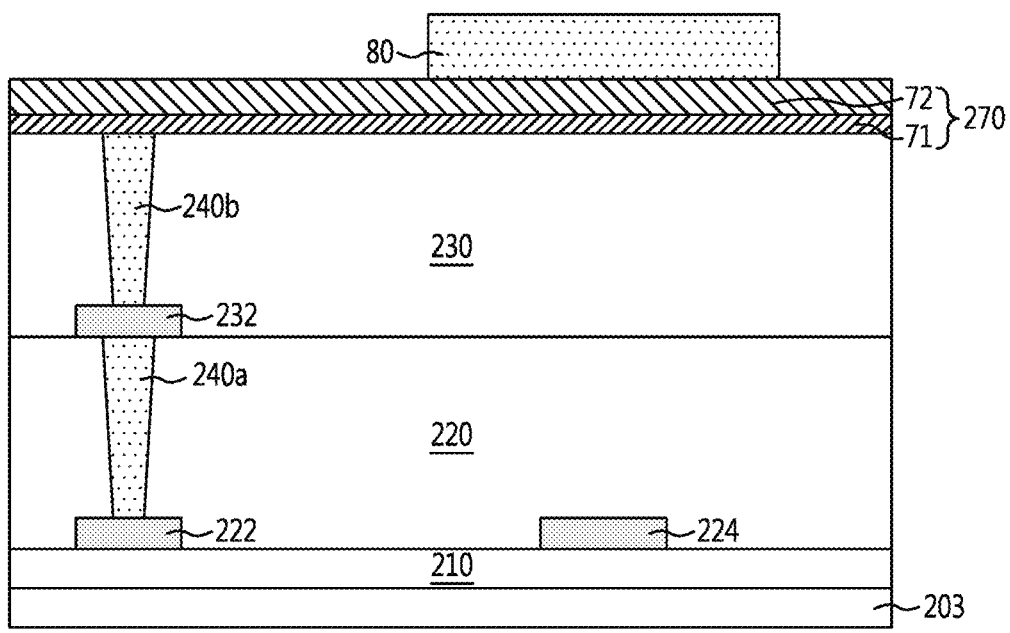
FIGS. 1-7 illustrate process diagrams for understanding manufacturing process of a semiconductor device having a high-voltage isolation capacitor in accordance with one or more embodiments.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order.

The features described herein may be embodied in different forms and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Advantages and features of the present disclosure and methods of achieving the advantages and features will be clear with reference to embodiments described in detail below together with the accompanying drawings. However, the present disclosure is not limited to the embodiments disclosed herein but will be implemented in various forms. The embodiments of the present disclosure are provided so that the present disclosure is adequately disclosed, and a person with ordinary skill in the art can fully understand the scope of the present disclosure. Meanwhile, the terms used in the present specification are for explaining the embodiments, not for limiting the present disclosure.

Terms, such as first, second, A, B, (a), (b) or the like, may be used herein to describe components. Each of these terminologies is not used to define an essence, order or sequence of a corresponding component but used merely to distinguish the corresponding component from other component(s). For example, a first component may be referred to as a second component, and similarly the second component may also be referred to as the first component.

Throughout the specification, when a component is described as being "connected to," or "coupled to" another component, it may be directly "connected to," or "coupled to" the other component, or there may be one or more other components intervening therebetween. In contrast, when an element is described as being "directly connected to," or "directly coupled to" another element, there can be no other elements intervening therebetween.

The singular forms "a", "an", and "the" are intended to include the plural forms as well, unless the context clearly indicates otherwise. It will be further understood that the terms "comprises/comprising" and/or "includes/including" when used herein, specify the presence of stated features, integers, steps, operations, elements, and/or components, but do not preclude the presence or addition of one or more other features, integers, steps, operations, elements, components and/or groups thereof.

Due to manufacturing techniques and/or tolerances, variations of the shapes shown in the drawings may occur. Thus, the examples described herein are not limited to the specific shapes shown in the drawings, but include changes in shape that occur during manufacturing.

FIGS. 1 to 7 illustrate process diagrams for illustrating manufacturing process of a semiconductor device having a high-voltage isolation capacitor in accordance with one or more examples of the present disclosure.

Referring to FIG. 1, a semiconductor device in accordance with one example may include a mixed-signal integrated circuit region 201 and a high-voltage isolation capacitor region 202. A mixed-signal integrated circuit is any integrated circuit that has both analog circuits and digital circuits on a single semiconductor die. The mixed-signal integrated circuit region 201 may have the mixed-signal integrated circuit or a digital signal processing circuit. The high-voltage isolation capacitor region 202 may have a capacitive isolation or a high-voltage isolation capacitor. The high-voltage isolation capacitor region 202 is designed to have a structure capable of a high-voltage isolation.

Referring to FIG. 1, a first inter-metal dielectric layer 210 is formed on a substrate 203. A bottom metal line 222 and a bottom electrode 224 are simultaneously formed in the first inter-metal dielectric layer 210 in a same step. The first inter-metal dielectric layer 210 may comprise SiO2, TEOS, USG or BPSG. The bottom metal line 222 and the bottom electrode 224 exist on the same plane. The bottom electrode 224 and the bottom and inter-metal lines 222, 232 may comprise Cu, Al, W, Ti, TiN, W, WN, Ta, TaN, etc. The first via 240a and the second via 240b may comprise a tungsten (W).

Subsequently, a second inter-metal dielectric layer 220 may be formed on the bottom electrode 224 and the bottom metal line 222. The second inter-metal dielectric layer 220 may comprise SiO2, FSG, TEOS, USG, HDP, SOG or BPSG. The second inter-metal dielectric layer 220 may also comprise low-k materials such as SiOC.

A first via 240a is formed to connect to the bottom metal line 222, wherein the first via 240a is formed in the second inter-metal dielectric layer 220. The first via 240a may comprise tungsten (W) or copper (Cu), etc. The first via 240a may be formed etching the second inter-metal dielectric layer 220, and then, depositing a material such as W or Cu and followed by a performing a CMP process on the second inter-metal dielectric layer 220 and W or Cu.

The inter-metal line 232 is formed to connect to the first via 240a. The inter-metal line 232 may comprise Cu, Al, W, Ti, TiN, W, WN, Ta, TaN, etc.

A third inter-metal dielectric layer 230 is formed on the inter-metal line 232. The third inter-metal dielectric layer 230 may comprise SiO2, FSG, TEOS, USG, HDP, SOG or BPSG. The second inter-metal dielectric layer 220 may also comprise low-k materials such as SiOC.

A second via 240b is formed to connect to the inter-metal line 232, wherein the second via 240b is formed in the third inter-metal dielectric layer 230. The second via 240b may be formed etching the third inter-metal dielectric layer 230, and then, depositing a material such as tungsten (W) and followed by a performing a CMP process on the third inter-metal dielectric layer 230 and W or Cu. A top surface of the third inter-metal dielectric layer 230 may be flat by performing the CMP process. In other words, the top surfaces of the second via 240b and the third inter-metal dielectric layer 230 are flat or coplanar with each other. The top surface of the second via 240b and the bottom surface of the low bandgap dielectric layer 270 may have the same plane. The first via 240a and the second via 240b are together electrically connected to the bottom metal line 222 and the inter-metal line 232.

Continuing to refer to FIG. 1, a low bandgap dielectric layer 270 is formed on the second via 240b and the third inter-metal dielectric layer 230. The low bandgap dielectric layer 270 is deposited with a thickness ranged from 200 nm to 2,000 nm. For example, the low bandgap dielectric layer 270 may have a bandgap ranged from 2.8 eV to 6 eV. The silicon dioxide has a bandgap of 9 eV. Therefore, the low bandgap dielectric layer 270 may have a bandgap lower than a bandgap of a silicon dioxide.

The low bandgap dielectric layer 270 may be with single layer or multi-layers. Hereinafter, an example of the low bandgap dielectric layer 270 will be described in the form of a bi-layers comprising a first sub-low bandgap dielectric layer 71 and a second sub-low bandgap dielectric layer 72. In this case, the first sub-low bandgap dielectric layer 71 may have a thickness different from that of the second sub-low bandgap dielectric layer 72. For example, as illustrated in FIG. 1, a thickness of the first sub-low bandgap dielectric layer 71 may be thinner than a thickness of the second sub-low bandgap dielectric layer 72.

The low bandgap dielectric layer 270 may comprise a material different from materials of the inter-metal dielectric layers 210, 220, 230. In detail, the low bandgap dielectric layer 270 may comprise a material having a bandgap lower than bandgaps of the inter-metal dielectric layers 210, 220, 230.

For example, the first sub-low bandgap dielectric layer 71 may comprise SiON or SiOC, silicon rich oxide, etc. The second sub-low bandgap dielectric layer 72 may comprise SiN or SiCN, silicon rich nitride, etc. So a bandgap of the first sub-low bandgap dielectric layer 71 and a bandgap of the second sub-low bandgap dielectric layer may be different from each other.

For example, a bandgap of the first sub-low bandgap dielectric layer 71 may be greater than a bandgap of the second sub-low bandgap dielectric layer 72. The third inter-metal dielectric layer 230 may comprise silicon dioxide, SiO2, so the bandgap of the SiO2 is about 9.

For example, SiN as the second sub-low bandgap dielectric layer 72 has a bandgap approximately 5. The first sub-low bandgap dielectric layer 71 may have a bandgap lower than the second sub-low bandgap dielectric layer 72 and higher than the third inter-metal dielectric layer 230.

Thus, a bandgap may be decreased in the order of: third inter-metal dielectric layer>first sub-low bandgap dielectric layer 71>second sub-low bandgap dielectric layer 72. Alternatively, a bandgap of the first sub-low bandgap dielectric layer 71 may be less than a bandgap of the second sub-low bandgap dielectric layer 72. The bandgap may be decreased in the order of: third inter-metal dielectric layer>second sub-low bandgap dielectric layer 72>first sub-low bandgap dielectric layer 71.

A photo resist pattern 80 is deposited on the low bandgap dielectric layer 270 to form a patterned low bandgap dielectric layer 270.

Figure 2:
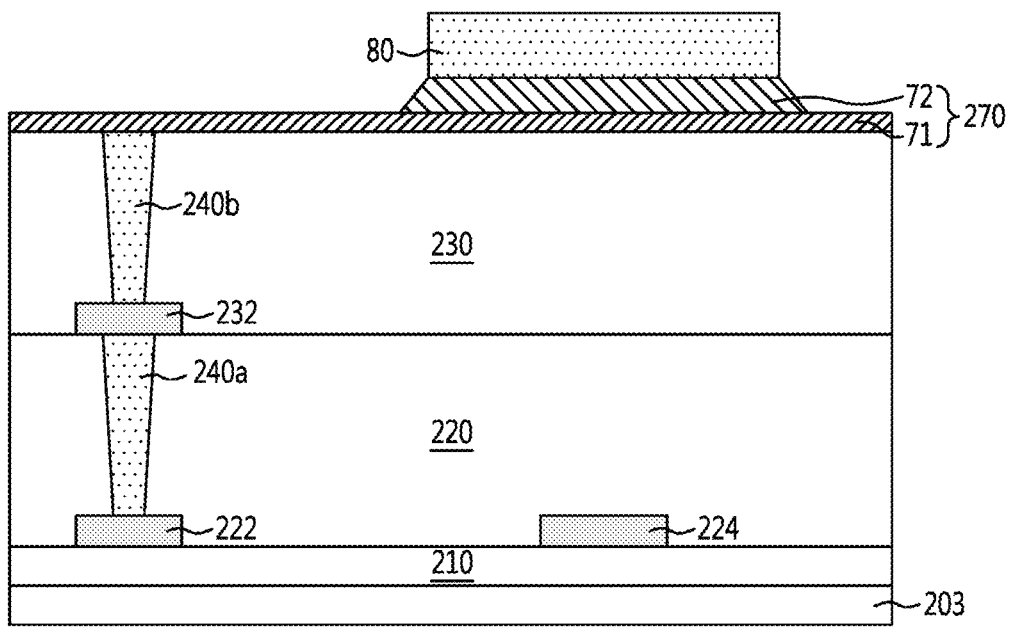

Referring to FIG. 2, a first etching process of etching the second sub-low bandgap dielectric layer 72 is performed using the photo resist pattern 80 as a mask to form a patterned second sub-low bandgap dielectric layer 72. A top surface of the first sub-low bandgap dielectric layer 71 may be exposed after performing the first etching process.

Figure 3:
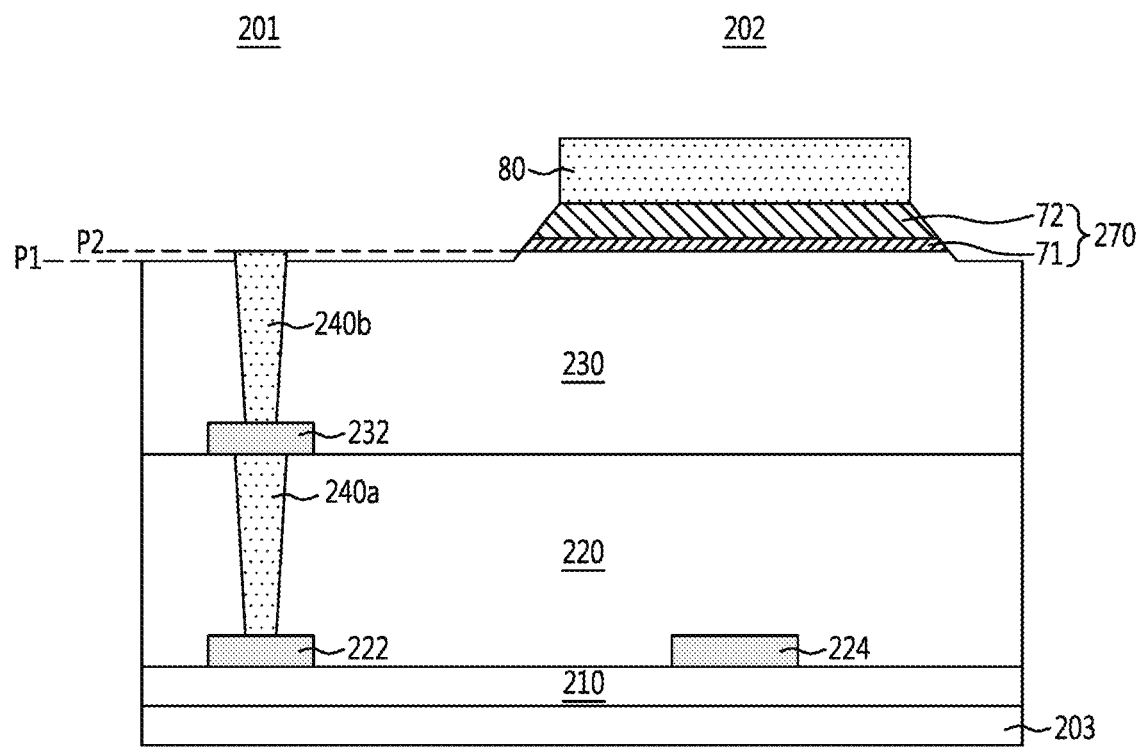

Referring to FIG. 3, a second etching process on the first sub-low bandgap dielectric layer 71 is performed using the same photo resist pattern 80 of FIG. 2 as a mask to form a pattered first sub-low bandgap dielectric layer 71. A top surface of a second via 240b may be exposed after performing the second etching process. By the second etching process, a portion of the third inter-metal dielectric layer 230 is also removed.

A first top surface P1 of the third inter-metal dielectric layer 230 may be lower than a second top surface P2 of the second via 240b after performing the second etching process. The first top surface P1 of the third inter-metal dielectric layer 230 may be also lower than a bottom surface of the patterned low bandgap dielectric layer 270.

By the first and second etching processes, the patterned low bandgap dielectric layer 270 is remained in the high-voltage isolation capacitor region 202. In other words, the patterned low bandgap dielectric layer 270 may overlap the bottom electrode 224.

Referring to FIG. 3, the pattered low bandgap dielectric layers 270 is slightly inclined with a respect to the top surface P1 of the third inter-metal dielectric layer 230 after performing the first and second etching processes. The photo resist pattern 80 is removed after the first and second etching processes.

Figure 4:
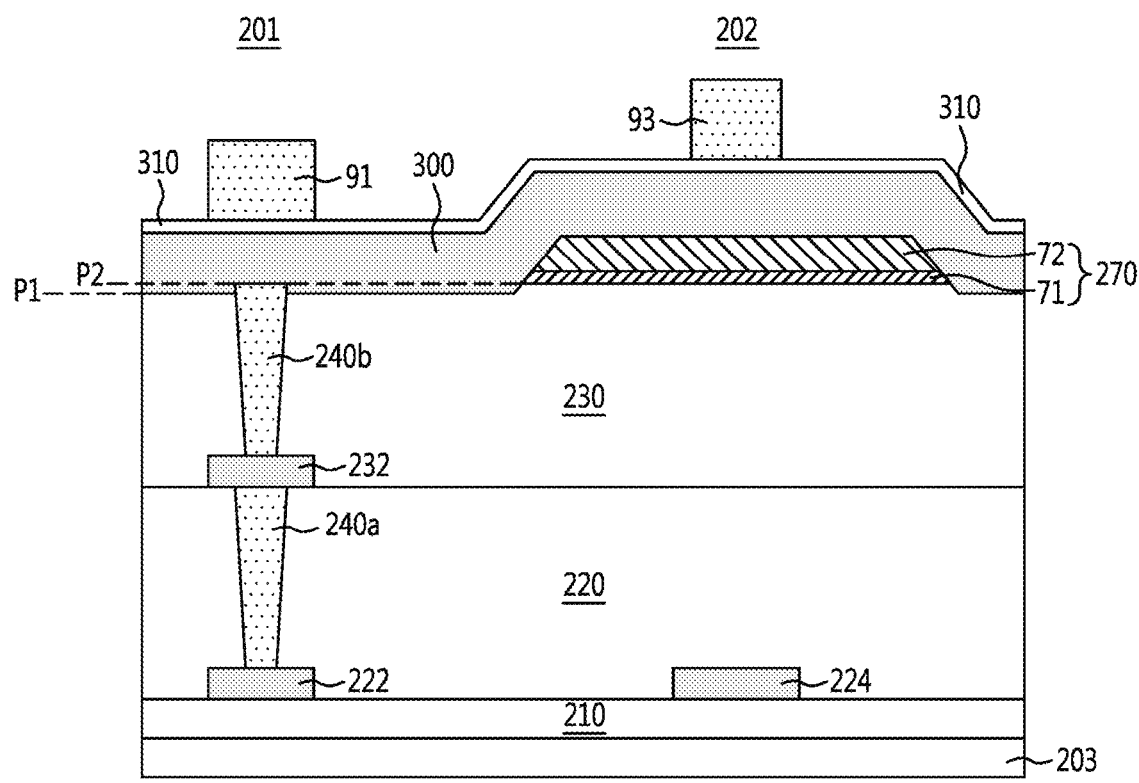

Referring to FIG. 4, a thick metal film 300 is formed on the exposed second via 240b and the patterned low bandgap dielectric layer 270 to form a top electrode and top metal line. Materials such as Al, Cu, Ti, TiN, W, WN, Ta, TaN may be implemented for the thick metal film 300. A hard mask layer 310 is optionally formed on the thick metal film 300. The hard mask layer 310 may comprise SiO2, SiN or SiON, etc. A hard mask layer 310 is beneficial for an etching process margin. Photo resist (PR) patterns 91, 93 are formed on the hard mask layer 310 to pattern the hard mask layer 310 and the thick metal film 300.

Figure 5:
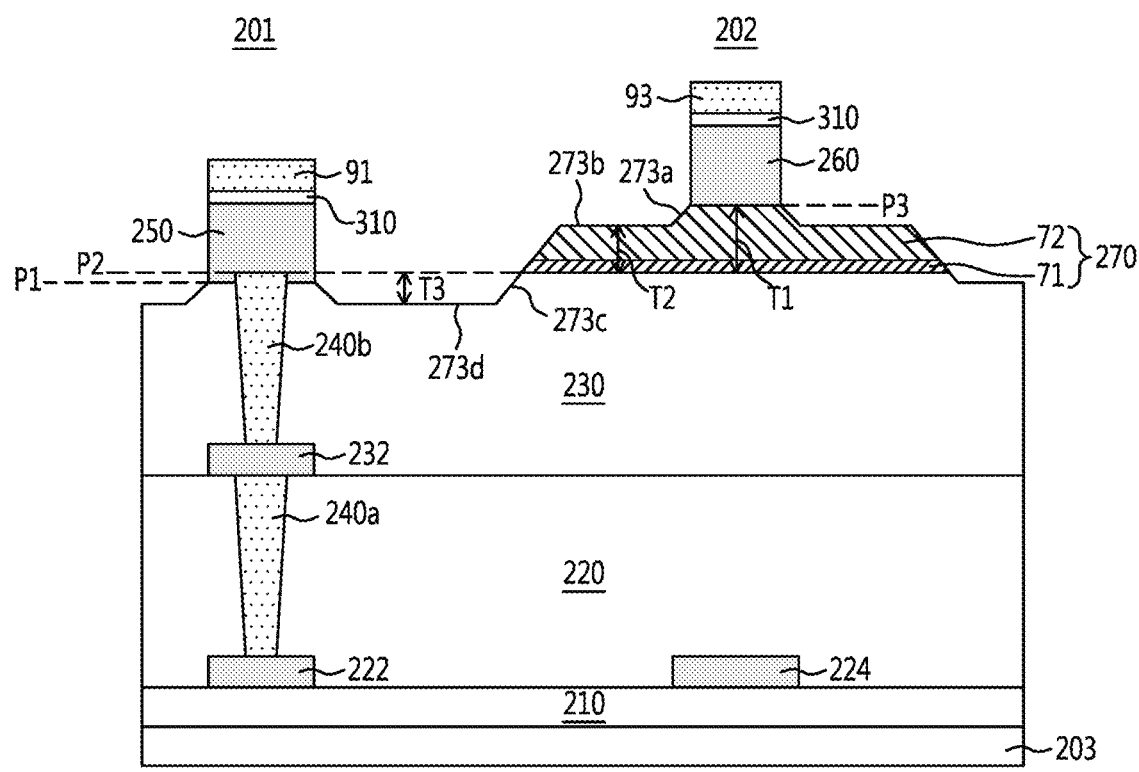

Referring to FIG. 5, a third etching process is performed using the PR patterns 91, 93 as a mask pattern. By the third etching process, a top metal line 250 and a top electrode 260 may be respectively formed in the mixed-signal integrated circuit region 201 and the high-voltage isolation capacitor region 202. In other words, the top metal line 250 connected with the second via 240b is formed in the mixed-signal integrated circuit 201. The top electrode 260 is formed on the low bandgap dielectric layer 270 in the high-voltage isolation capacitor region 202.

As illustrated in FIG. 5, a portion of the low bandgap dielectric layer 270 may be exposed and being further etched during the third etching process. First, a portion of the second sub-low bandgap dielectric layer 72 is partially etched again. The second thickness T2 of the second sub-low bandgap dielectric layer 72 is further reduced from the original second thickness T2. As described above, the second sub-low bandgap dielectric layer 72 have two different thicknesses. So the patterned low bandgap dielectric layer 270 has two different thicknesses, i.e., T1 and T2. The second thickness T2 of the patterned low bandgap dielectric layer 270 which do not overlap the top electrode 260 is smaller than the first thickness T1 of the low bandgap dielectric layer 270 which overlaps the top electrode 260.

By the third etching process, a thickness of the low bandgap dielectric layer 270 outside the top electrode 260 may finally become the second thickness T2. After the third etching process, the low bandgap dielectric layer 270 may include first and second inclination zones 273a, 273c and a flat zone 273b disposed between the first inclination zone 273a and the second inclination zone 273c.

As illustrated in FIG. 5, a loss of the third inter-metal dielectric layer 230 has occurred by the third etching process. A top surface of the third inter-metal dielectric layer 230 may be etched by a thickness T3 by the third etching process. Thus, the third inter-metal dielectric layer 230 may have a lowermost surface 273d. The lowermost surface 273d formed by the third etching process may be lower than a bottom surface P1 of the top metal line 250 or a bottom surface P2 of the first sub-low bandgap dielectric layer 71. Furthermore, the lowermost surface 273d may be lower than a top surface P2 of the second via 240b by the third etching process.

After the third etching process, PR patterns 91, 93 are removed. At this time, a patterned hard mask layer 310 may be still remained on the top metal line 250 and the top electrode 260, although the patterned hard mask layer 310 may be slightly reduced in a thickness. The patterned hard mask layer 310 may protect so that the top metal line 250 and a top surface of the top electrode 260 are not etched while the third etching process being performed.

Figure 6:
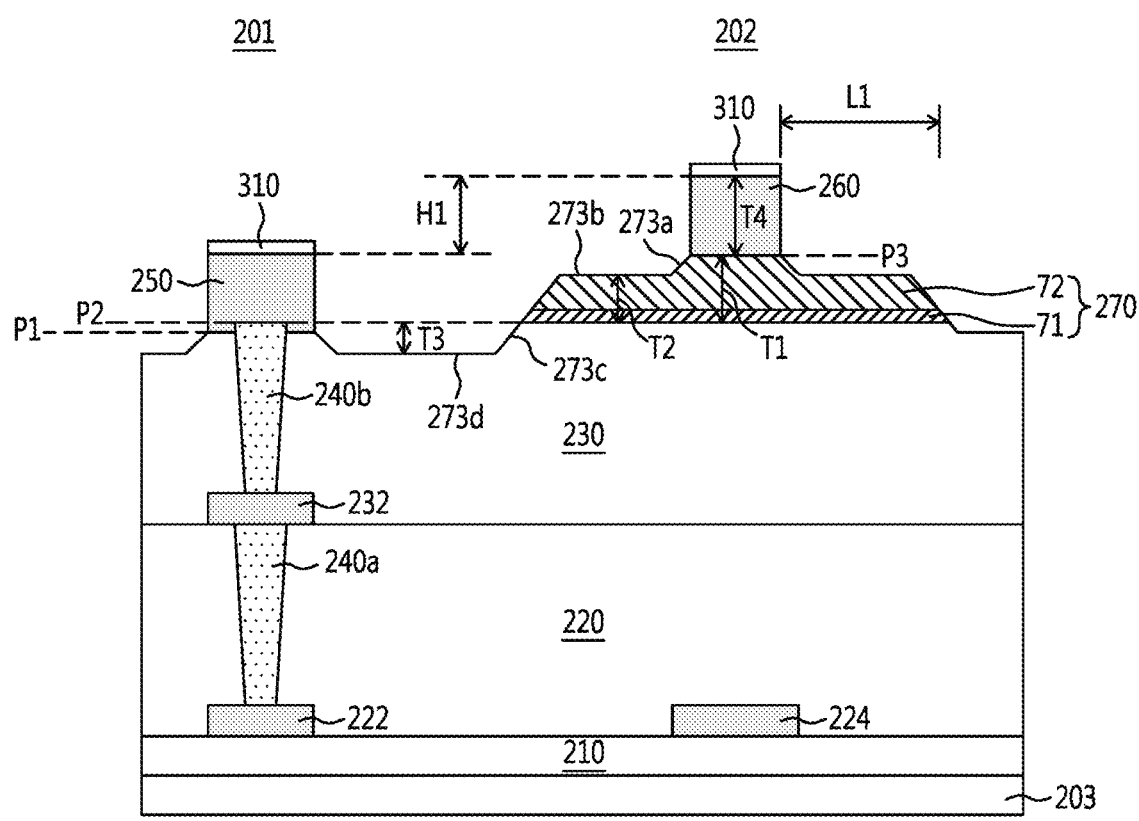

Referring to FIG. 6, the low bandgap dielectric layer 270 may have similar height to the top metal line 250 and it may parallel with the top metal line 250. The bottom surface P3 of the top electrode 260 may be positioned higher than the bottom surface P1 of the top metal line 250. A length L1 of the low bandgap dielectric layer 270 that extends horizontally beyond the top electrode 260 may be greater than a fourth thickness T4 of the top electrode 260.

Figure 7:
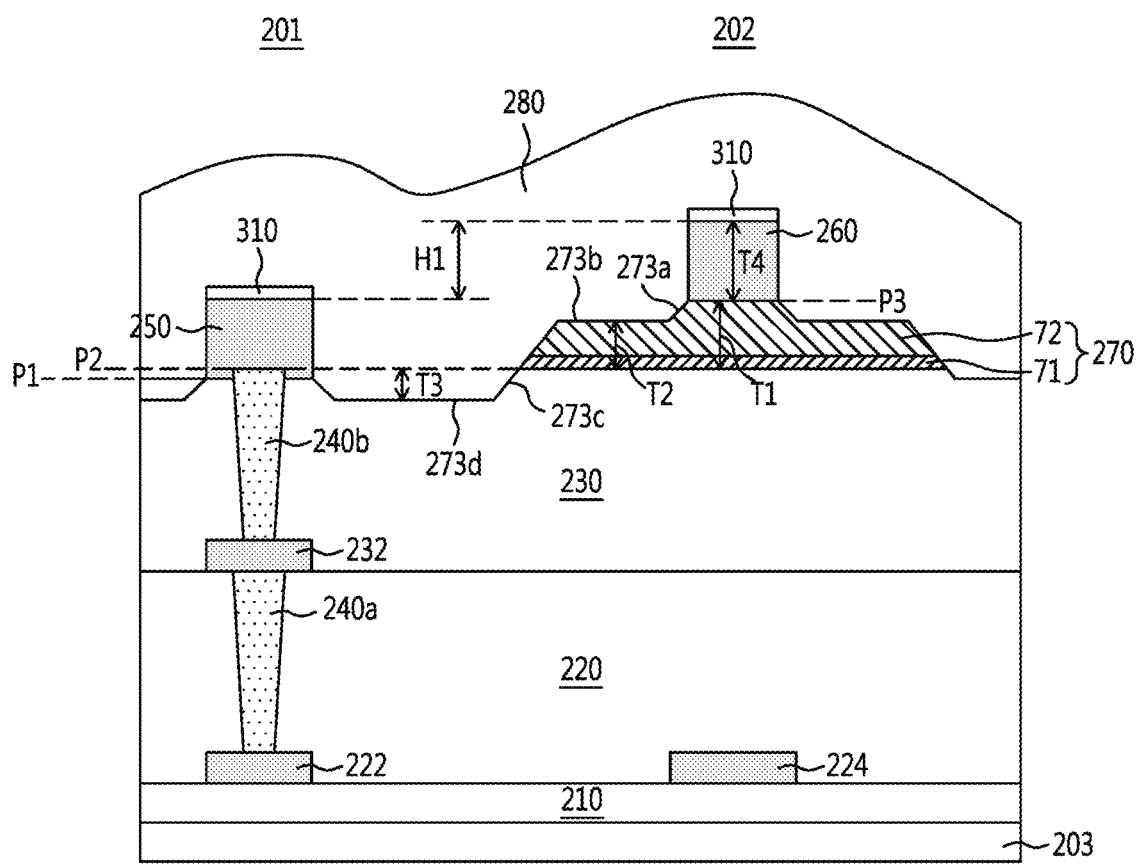

Referring to FIG. 7, a passivation layer 280 is deposited to cover the top metal line 250 and the top electrode 260. The passivation layer 280 is continuously deposited to the mixed-signal integrated circuit region 201 and high-voltage isolation capacitor region 202. The passivation layer 280 may be deposited to be in contact with the top metal line 250 and the top electrode 260. The passivation layer 280 may be formed with a stacked SiO2/SiN. Although not illustrated, for pad open, a patterning process of the passivation layer 280 may be performed.

As illustrated in FIG. 7, no low bandgap dielectric layer 270 is disposed under the top metal line 250 in the mixed-signal integrated circuit 201. Therefore, in the mixed-signal integrated circuit region 201 of the semiconductor device in accordance with one or more examples, a leakage current arising from the low bandgap dielectric layer 270 may be reduced. Meanwhile, in the high-voltage isolation capacitor region 202, the low bandgap dielectric layer 270 is remained under the top electrode 260.

In accordance with the present disclosure, herein is provided a semiconductor device having a high-voltage isolation capacitor and a method for manufacturing the same. The semiconductor device is characterized by that a low bandgap dielectric layer for providing a high-voltage isolation is formed in the high-voltage isolation capacitor and the low bandgap dielectric layer is absent in the mixed-signal integrated circuit.

A number of embodiments have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor device manufacturing method, comprising:
   providing a high-voltage isolation capacitor region and a mixed-signal integrated circuit region on a substrate;
   forming a bottom electrode on the high-voltage isolation capacitor region;
   forming a bottom metal line on the mixed-signal integrated circuit region;
   forming an inter-metal dielectric layer on the bottom electrode and the bottom metal line;
   forming a top via in the inter-metal dielectric layer;
   forming a low bandgap dielectric layer on the top via and the inter-metal dielectric layer;
   patterning the low bandgap dielectric layer to form a patterned low bandgap dielectric layer;
   depositing a thick metal film on the top via and the patterned low bandgap dielectric layer; and
   patterning the thick metal film to form a top metal line on the high-voltage isolation capacitor region and form a top electrode on the mixed-signal integrated circuit region, wherein the top metal line is connected to the top via, and wherein the patterned low bandgap dielectric layer is retained under the top electrode, and is absent under the top metal line.

2. The method of claim 1, further comprising:
forming a hard mask layer on the thick metal film; and
patterning the hard mask layer to form a patterned hard mask layer on each of the top metal line and the top electrode.

3. The method of claim 1, further comprising:
forming a passivation layer on, and in direct contact with, the patterned low bandgap dielectric layer, the top metal line and the top electrode.

4. The method of claim 1, wherein the patterned low bandgap dielectric layer comprises:
a first portion overlapped with the top electrode and having a first thickness; and
a second portion outside the top electrode having a second thickness less than the first thickness.

5. The method of claim 1,
wherein the low bandgap dielectric layer comprises:
a first sub-low bandgap dielectric layer having a first thickness; and
a second sub-low bandgap dielectric layer having a second thickness which is greater than the first thickness.

6. The method of claim 5, wherein the second sub-low bandgap dielectric layer comprises:
a first portion overlapped with the top electrode; and
a second portion outside the top electrode having a thickness that is less than a thickness of the first portion.

7. A semiconductor device manufacturing method, comprising:
forming a bottom electrode and a bottom metal line in a substrate;
forming an inter-metal dielectric layer on the bottom electrode and the bottom metal line;
forming an inter-metal line overlapping the bottom metal line;
forming a via connected to the inter-metal line;
depositing a low bandgap dielectric layer on the via and the inter-metal dielectric layer;
removing a portion of the low bandgap dielectric layer which overlaps the via to expose a top surface of the via, and retaining the low bandgap dielectric layer overlapped with the bottom electrode;
depositing a thick metal film on the exposed via and the low bandgap dielectric layer;
patterning the thick metal film to form a top metal line and form a top electrode,
wherein the top metal line is connected to the via, and wherein the low bandgap dielectric layer is retained under the top electrode, and is absent under the top metal line.

8. The method of claim 7, further comprising:
forming a hard mask layer on each of the top metal line and the top electrode; and
forming a passivation layer on the hard mask layer,
wherein the passivation layer is in direct contact with the low bandgap dielectric layer, the top metal line and the top electrode.

9. The method of claim 7, wherein the low bandgap dielectric layer comprises:
a first portion overlapped with the top electrode and having a first thickness; and
a second portion disposed outside the top electrode having a second thickness smaller than the first thickness.

10. The method of claim 7, wherein the low bandgap dielectric layer comprises:
a first sub-low bandgap dielectric layer having a first thickness; and
a second sub-low bandgap dielectric layer having a second thickness that is greater than the first thickness.

11. The method of claim 10, wherein the second sub-low bandgap dielectric layer comprises:
a first portion overlapped with the top electrode; and
a second portion disposed outside the top electrode having a thickness that is less than a thickness of the first portion.

* * * * *